United States Patent [19]
Ahmad et al.

[11] Patent Number: 5,405,791
[45] Date of Patent: Apr. 11, 1995

[54] PROCESS FOR FABRICATING ULSI CMOS CIRCUITS USING A SINGLE POLYSILICON GATE LAYER AND DISPOSABLE SPACERS

[75] Inventors: Aftab Ahmad; Tyler A. Lowrey, both of Boise, Id.

[73] Assignee: Micron Semiconductor, Inc., Boise, Id.

[21] Appl. No.: 317,280

[22] Filed: Oct. 4, 1994

[51] Int. Cl.$^6$ ............... H01L 21/336; H01L 21/8238
[52] U.S. Cl. ................................. 437/34; 437/44; 437/57; 437/228
[58] Field of Search ............... 437/34, 44, 57, 58, 437/45, 228, 41

[56] References Cited

U.S. PATENT DOCUMENTS

| | | | |
|---|---|---|---|
| 4,722,909 | 2/1988 | Parillo et al. | 437/34 |
| 4,745,086 | 5/1988 | Parillo et al. | 437/57 |
| 4,753,898 | 6/1988 | Parillo et al. | 437/44 |
| 4,764,477 | 8/1988 | Chang et al. | 437/29 |
| 4,771,014 | 9/1988 | Liou et al. | 437/41 |
| 4,818,714 | 4/1989 | Haskell | 437/44 |
| 4,968,639 | 11/1990 | Bergonzoni | 437/57 |
| 4,994,404 | 2/1991 | Sheng et al. | 437/44 |
| 5,010,030 | 4/1991 | Pfiester et al. | 437/192 |
| 5,015,595 | 5/1991 | Wollesen | 437/31 |
| 5,021,354 | 6/1991 | Pfiester | 437/34 |
| 5,024,959 | 6/1991 | Pfiester | 437/34 |
| 5,087,582 | 2/1992 | Campbell et al. | 437/41 |
| 5,234,850 | 8/1993 | Liao | 437/44 |

FOREIGN PATENT DOCUMENTS

0456318 11/1991 European Pat. Off. .

OTHER PUBLICATIONS

Pfiester et al., "An Advanced 0.5-um CMOS Disposable TiN LDD/Salicide Spacer Process", IEEE Electron Device Letters, vol. 11, No. 7, Jul. 1990, pp. 318–320.

Pfiester, J., et al., "A Poly-Framed LDD ...", IEEE Elect. Device Letters, vol. 11, No. 11, Nov. 1990, pp. 529–531.

Parillo, L., et al., "Disposable Polysilicon LDD Spacer ...", iEEE Trans. Elect. Devices, vol. 38, No. 1, Jan. 1991, pp. 39–46.

Pfiester, J., et al., "An Integrated 0.5 $\mu$m CMOS ..." IEEE IEDM Tech. Digest, Dec. 1989, pp. 781–784.

Ronkainen, H., et al., "The Use of Disposable Double Spacer ...", IEEE Electron Device Letters, vol. 12, No. 3, Mar. 1991, pp. 125–127.

Lu, C., et al., "Submicrometer Salicide CMOS Devices ...", IEEE Electron Device Letters, vol. 19 No. 11, Nov. 1989, pp. 487–489.

*Primary Examiner*—T. N. Quach
*Attorney, Agent, or Firm*—Angus C. Fox, III

[57] ABSTRACT

This invention is a process for fabricating ultra-large-scale integration CMOS circuits using a single polysilicon gate layer for both N-channel and P-channel devices, a single mask step for defining the gates of both N-channel and P-channel devices, the fabrication of one set of disposable spacers for N-channel implants, and the fabrication of another set of disposable spacers for P-channel source/drain implants. The set of spacers used for P-channel implants also comprises material deposited to fabricate the spacers for the N-channel implants. The process is adaptable to LDD structures for both N-channel and P-channel devices or for only N-channel devices. The process is also compatible with anti-punchthrough implants for both types of devices.

27 Claims, 8 Drawing Sheets

PROCESS FOR FABRICATING ULSI CMOS CIRCUITS USING A SINGLE POLYSILICON GATE LAYER AND DISPOSABLE SPACERS

FIELD OF THE INVENTION

This invention relates to the fabrication of CMOS circuits and, more particularly, to a process for fabricating ultra-large-scale integration (ULSI) devices using a single polycrystalline silicon layer, a single patterning step for both N-channel and P-channel devices, and multiple disposable spacers for anti-punchthrough and source/drain implants.

BACKGROUND OF THE INVENTION

As integration levels have moved up scale, it has been necessary to decrease channel lengths and thin gate oxide layers for insulated-gate field-effect transistors. The reduction of device dimensions results in a number of short-channel effects which readily manifest themselves in simple devices. One short-channel effect is punchthrough, which results in significant current leakage during transistor "off" states. Effectively, when punchthrough is present, there is no true "off" state. This effect has been mitigated by the use of anti-punchthrough implants in the channel region. For N-channel devices, a low-dosage boron implant is commonly used; for P-channel devices, a low-dosage phosphorus or arsenic implant is used. Another short-channel effect is hot electron injection into the gate oxide layer. This phenomenon results in a reduction of threshold voltage over time. The cause is generally recognized to be a combination of high electric field at the transistor drain and collisions between electrons flowing through the channel with the silicon crystal lattice. Hot electron injection can be reduced by oxidizing the gate edge near the drain. This not only increases gate oxide layer thickness at the gate edge, but also tends to round the gate edge. In addition, lightly-doped drain (LDD) structures have been almost universally adopted for devices at the VLSI level and beyond. An LDD device has a lightly-doped drain region adjacent the channel and a heavily-doped drain region adjacent the lightly-doped drain region, but set back from the channel.

Transistors having LDD structures are generally fabricated using permanent dielectric spacers which are formed on the sidewalls of the device gates. N$^-$ and P$^-$ implants are performed before spacer formation; N$^+$ and P$^+$ implants are performed after spacer formation. As spacers are designed to have sufficient height and density to trap ions which are being implanted directly above them, a spacer will result in ions being implanted in a region of the substrate that is offset from the gate edge a distance that is equal to the width of the spacer.

Within the past several years, the fabrication of LDD structures has been described using disposable spacers. By reversing the order of the LDD N$^-$ and P$^-$ implantation steps with respect to the N$^+$ and P$^{30}$ implantation steps, respectively, a reduction in process complexity can be achieved.

SUMMARY OF THE INVENTION

This invention is a process for fabricating ultra-large-scale integration CMOS circuits using a single polysilicon gate layer for both N-channel and P-channel devices, a single mask step for defining the gates of both N-channel and P-channel devices, the fabrication of one set of disposable spacers for N-channel implants, and the fabrication of another set of disposable spacers for P-channel source/drain implants. The set of spacers used for P-channel implants also comprises material deposited to fabricate the spacers for the N-channel implants. The process is adaptable to LDD structures for both N-channel and P-channel devices or for only N-channel devices. The process is also compatible with anti-punchthrough implants for both types of devices.

PREFERRED EMBODIMENT OF THE INVENTION

FIGS. 1 through 11 depict the process flow for a first embodiment of the process which constitutes the invention. FIGS. 1A through 11A depict the process flow for a second equivalent embodiment of the process.

Figure 1:
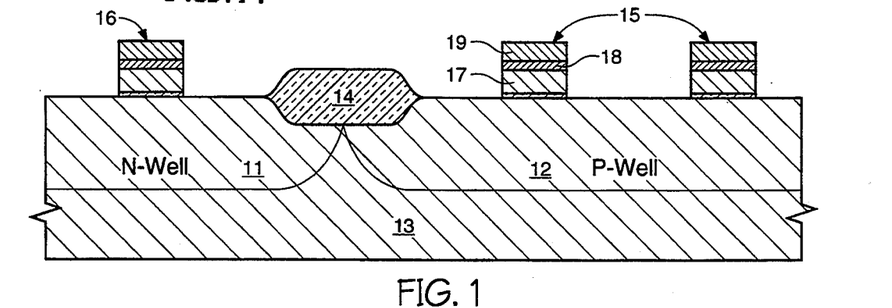
FIG. 1 is a cross-sectional view of a portion of in process CMOS circuitry depicting both an N-well region and a P-well region within a silicon substrate, a pair of N-channel gate sandwich structures having a polysilicon lower layer, a refractory metal silicide center layer, and a silicon nitride upper layer, a single P-channel gate sandwich structure having a composition identical to that of the N-channel gate sandwich structures, and a field isolation oxide region located on the surface of the silicon substrate at the intersection of the N-well and the P-well.

Referring now to FIG. 1, a cross-sectional view of a portion of in-process CMOS circuitry is depicted following the formation of an N-well region 11 and a P-well region 12 within a silicon substrate 13, the fabrication of a field isolation oxide region 14 located on the surface of the silicon substrate at the intersection of the N-well region 11 and the P-well region 12, and the fabrication of a pair of N-channel gate sandwich structures 15 and a single P-channel gate sandwich structure 16. Both types of gate sandwich structures have a polysilicon lower layer 17, a refractory metal silicide center layer (e.g., tungsten silicide) 18, and a silicon nitride upper layer 19. Other materials, which are selectively etchable with respect to silicon dioxide, may be substituted for the silicon nitride upper layer 19.

Figure 2:
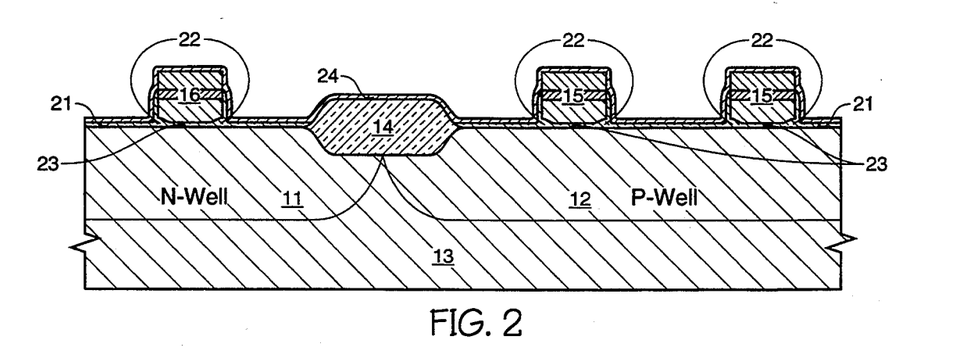
FIG. 2 is a cross-sectional view of the portion of the in-process CMOS circuitry of FIG. 1 following a source/drain reoxidation step and deposition of a thin silicon nitride layer.

Referring now to FIG. 2, the in-process circuitry of FIG. 1 has been subjected to a source/drain reoxidation step which has formed a thermal oxide layer 21 on the surface of the source/drain regions and on the sidewalls of both N-channel and P-channel transistor gates. The reoxidation step also causes the formation of a slight bird's beak structure 22 under both edges of each transistor gate, which lowers the lateral electric field strength in N-channel transistor drain regions, thereby reducing hot electron injection into the gate oxide layer 23. Following the reoxidation step, a layer of silicon nitride dielectric etch-stop layer 24 is blanket deposited over the in-process circuitry. Other materials, which are selectively etchable with respect to silicon dioxide, may be substituted for the silicon nitride etch-stop layer 24. Although dielectric materials are preferred, polysilicon may also be used if later removed to protect against shorting between devices.

Figure 3:
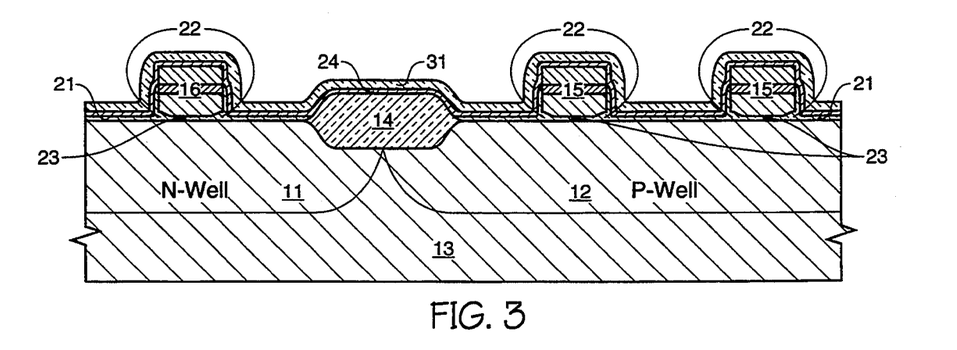
FIG. 3 is a cross-sectional view of the portion of the in-process CMOS circuitry of FIG. 2 following the deposition of a first ozone TEOS oxide layer.

Referring now to FIG. 3, the in-process circuitry of FIG. 2 has been subjected to a first chemical vapor deposition step using tetra-ethyl-ortho-silicate (TEOS) and ozone as precursor compounds. A first ozone TEOS oxide layer 31 is formed which blankets the circuitry.

Figure 4:
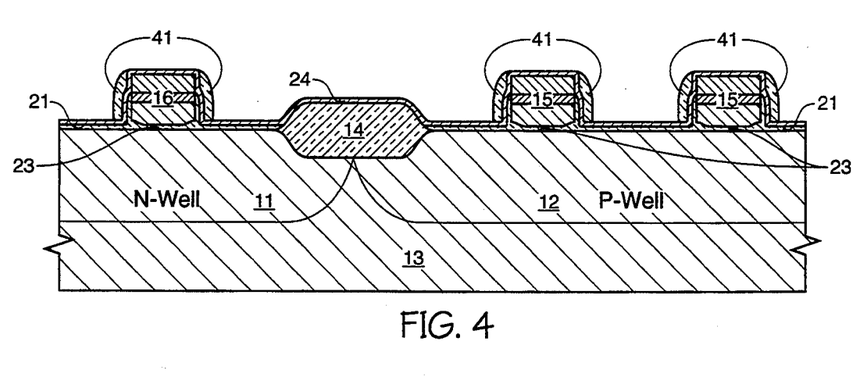
FIG. 4, which is exemplary of a first embodiment sequence of the process, is a cross-sectional view of the portion of the in-process CMOS circuitry of FIG. 3 following a first anisotropic spacer etch.

Referring now to FIG. 4, the in-process circuitry of FIG. 3 has been subjected to a first anisotropic spacer etch which has formed a first set of disposable spacers 41, from the first ozone TEOS oxide layer 31, on the sidewalls of both N-channel transistor gate structures 15 and P-channel transistor gate structures 16.

Figure 5:
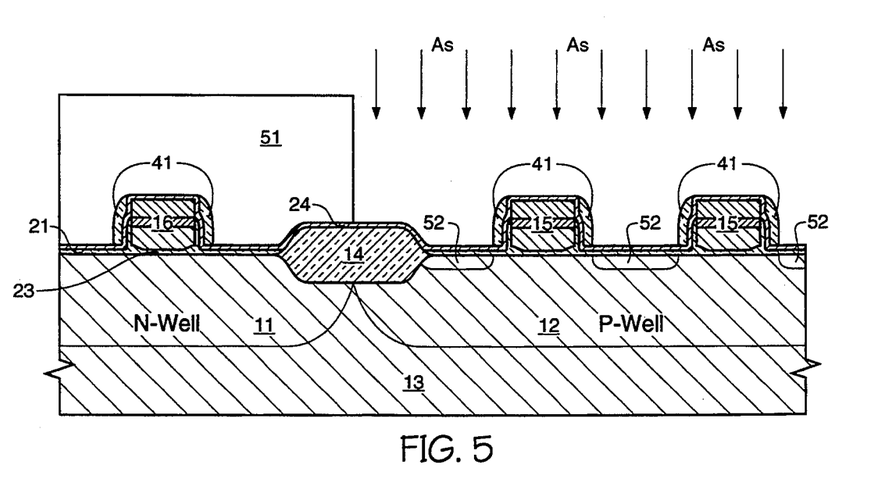
FIG. 5 is a cross-sectional view of the portion of the in-process CMOS circuitry of FIG. 4 following a first photoresist masking step followed by an N$^+$ arsenic source/drain implant step.

Referring now to FIG. 5, the in-process circuitry of FIG. 4 has been masked with a first photoresist mask 51, which masks the N-well region 11. Following the masking of the N-well region 11, an N+arsenic source/drain implant step is performed, which creates heavily-doped N-channel source/drain regions 52.

Figure 6:
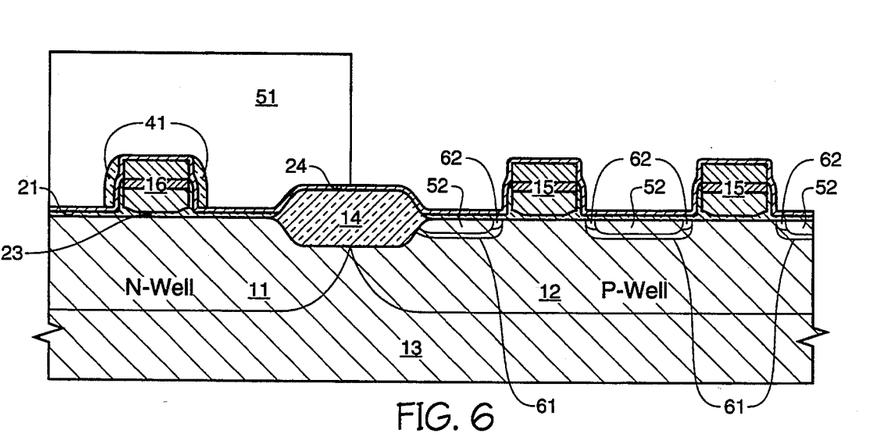
FIG. 6 is a cross-sectional view of the portion of the in-process CMOS circuitry of FIG. 5 after a first wet etch step which removes the disposable spacers on N-channel devices, followed by an N$^-$ source/drain implant step and a boron N-channel anti-punchthrough implant step.

Referring now to FIG. 6, the in-process circuitry of FIG. 5 has been subjected to a first wet etch step which removes the first set of spacers 41 from the sidewalls of only the N-channel transistor gate structures 15. The first set of spacers 41 on the sidewalls of the P-channel transistor gate structures 16 are protected from the first wet etch step by the first photoresist mask 51. Removal of the first set of spacers 41 from the sidewalls of the N-channel transistor gate structures 15 is followed by a boron halo implant which creates N-channel anti-punchthrough regions 61, and low-dosage arsenic source/drain implant which creates lightly-doped N-channel source/drain regions 62. The low-dosage arsenic implant and the boron halo implant can be reversed in sequence with an equivalent result.

Figure 7:
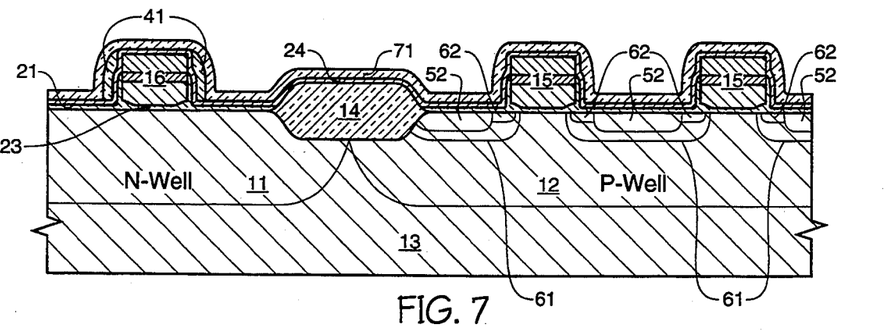
FIG. 7 is a cross-sectional view of the portion of the in-process CMOS circuitry of FIG. 6 following a first photoresist strip step, a thermal drive step, and the deposition of a second ozone TEOS oxide layer.

Referring now to FIG. 7, the in-process circuitry of FIG. 6 has been subjected to a first photoresist strip step in order to remove first photoresist mask 51, a thermal drive step, and a second chemical vapor deposition step, which forms a second ozone TEOS oxide layer 71 that blankets the circuitry. The thermal drive step facilitates the incorporation of the implanted high-dosage arsenic and boron atoms into the crystal lattice of the substrate 13, heals damage in the crystal lattice occasioned by the implant step, and drives the implanted arsenic and boron atoms deeper into the substrate. It will be noted that the second ozone TEOS oxide layer 71 covers the first set of spacers 41 that remain on the sidewalls of the P-channel transistor gate structures 16.

Figure 8:
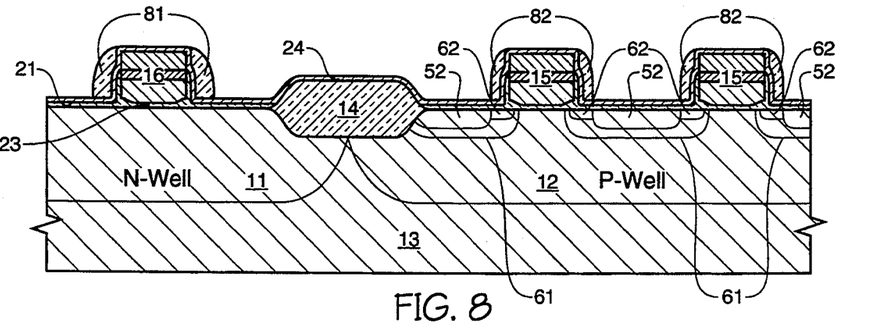
FIG. 8 is a cross-sectional view of the portion of the in-process CMOS circuitry of FIG. 7 following a second anisotropic spacer etch.

Referring now to FIG. 8, the in-process circuitry of FIG. 7 has been subjected to a second anisotropic spacer etch, which has formed a second set of disposable spacers 81 on sidewalls of the P-channel transistor gate structures 16. A third set of disposable spacers 82 is formed on the sidewalls of the N-channel gate structures 15. It will be noted that, for P-channel gate structures, the second set of spacers 81 incorporates the first set of spacers 41, and is therefore wider than the first set of spacers 41. This wide second set of spacers 81 are designed to position the heavy-dosage P+implant which will be subsequently performed so as to optimize the performance of the P-channel devices.

Figure 9:
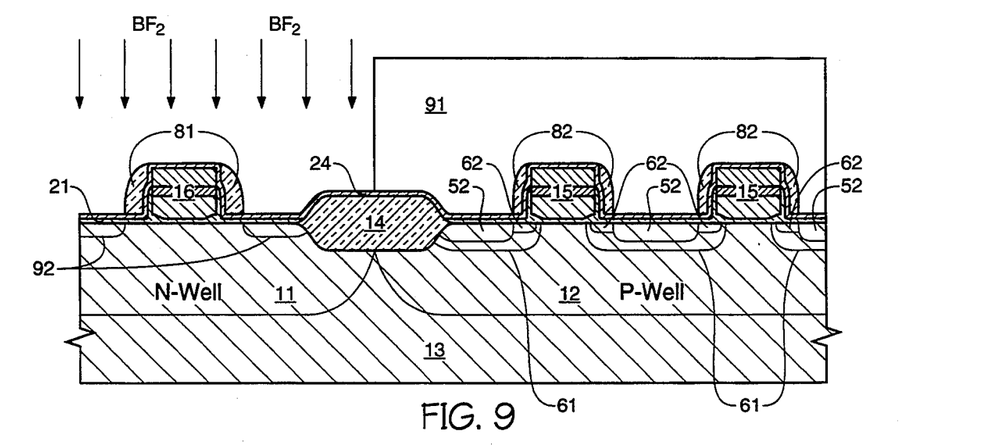
FIG. 9 is a cross-sectional view of the portion of the in-process CMOS circuitry of FIG. 8 following a second photoresist masking step followed by a P$^+$ boron-difluoride source/drain implant step.

Referring now to FIG. 9, the in-process circuitry of FIG. 8 has been masked with a second photoresist mask 91, which masks the P-well region 12. Following the masking of the P-well region 12, a P+ boron difluoride source/drain implant step is performed, which creates heavily-doped P-channel source/drain regions 92.

Figure 10:
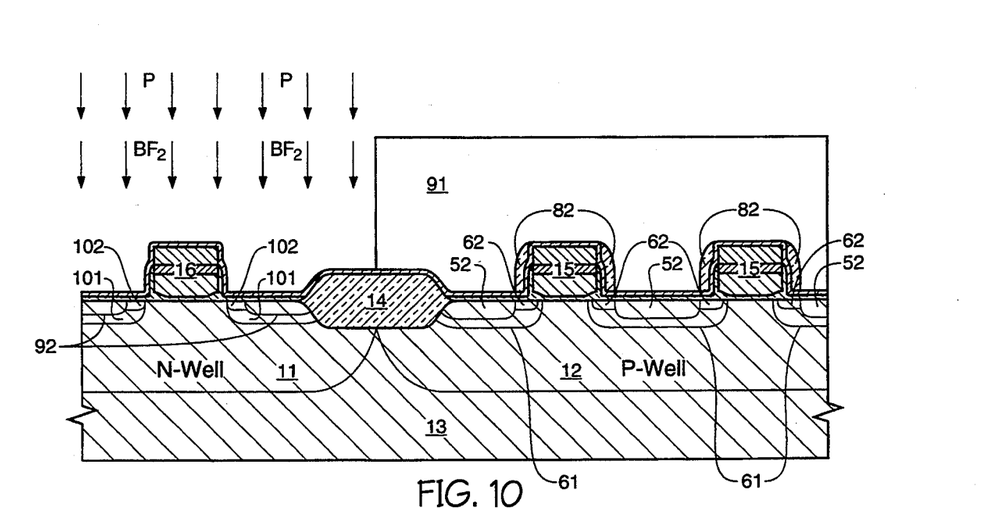
FIG. 10 is a cross-sectional view of the portion of the in-process CMOS circuitry of FIG. 9 following a second wet etch step which removes the disposable spacers on P-channel devices, followed by a phosphorus P-channel anti-punchthrough step, and an optional P$^-$ source/drain implant step.

Referring now to FIG. 10, the in-process circuitry of FIG. 9 has been subjected to a second wet etch step which removes the second set of disposable spacers 81 from the sidewalls of the P-channel transistor gate structures 16. The second wet etch step is followed by a phosphorus halo implant step which forms P-channel anti-punchthrough regions 101, and an optional low-dosage P⁻source/drain implant step which forms lightly-doped P-channel source/drain regions 102. The low-dosage P⁻implant step and the phosphorus halo implant step may be reversed in sequence with an equivalent result.

Figure 4A:
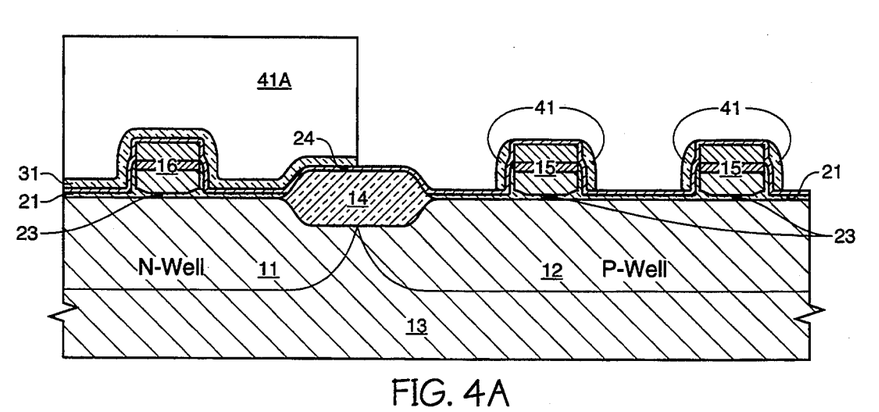
FIG. 4A, which is exemplary of a second embodiment sequence of the process, is a cross-sectional view of the portion of the in-process CMOS circuitry of FIG. 3 following the masking of P-well circuitry with a first photoresist mask and a subsequent first anisotropic spacer etch.

Referring now to FIG. 4A, the in-process circuitry of FIG. 3 has been masked with a first photoresist mask 41A which masks the N-well region 11, and then subjected to a first anisotropic spacer etch which has formed a first set of disposable spacers 42A on the sidewalls of only the N-channel transistor gate structures 15. The entire N-well region 11 remains blanketed by the ozone TEOS layer 31.

Figure 5A:
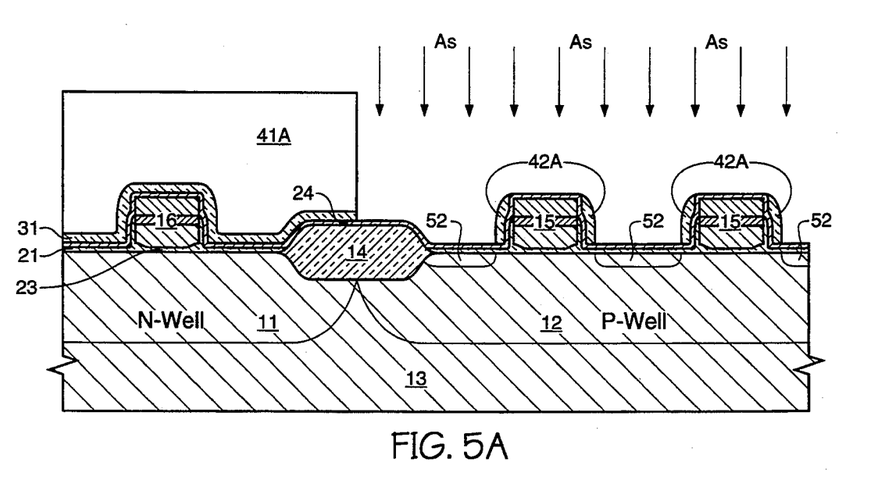
FIG. 5A is a cross-sectional view of the portion of the in-process CMOS circuitry of FIG. 4A following an N+arsenic source/drain implant step.

Referring now to FIG. 5A, the in-process circuitry of FIG. 4A has been subjected to an N⁺arsenic source/drain implant step, which has created heavily-doped N-channel source/drain regions 52.

Figure 6A:
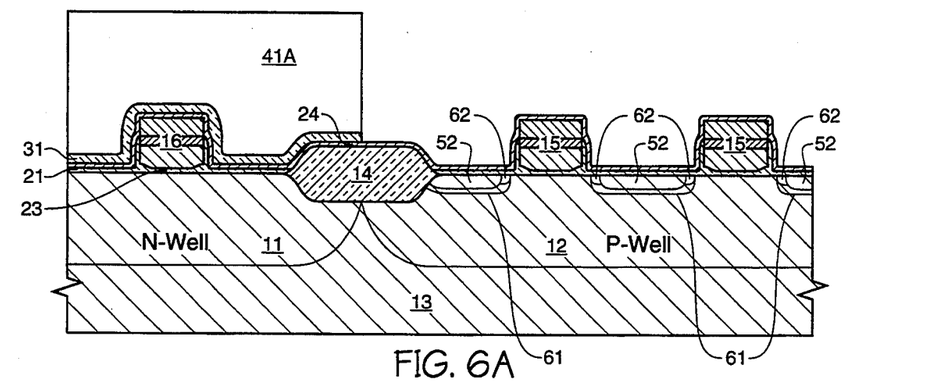
FIG. 6A is a cross-sectional view of the portion of the in-process CMOS circuitry of FIG. 5A after a first wet etch step which removes the disposable spacers on N-channel devices, followed by an N−source/drain implant step and a boron N-channel anti-punchthrough implant step.

Referring now to FIG. 6A, the in-process circuitry of FIG. 5A has been subjected to a first wet etch step which removes the first set of disposable spacers 42A from the sidewalls of the N-channel transistor gate structures 15. The ozone TEOS layer 31 which blankets the N-well region 11 is protected from the first wet etch step by the first photoresist mask 41A. Removal of the first set of spacers 42A from the sidewalls of the N-channel transistor gate structures 15 is followed by a boron halo implant which creates N-channel anti-punchthrough regions 61, and low-dosage arsenic N⁻source/drain implant which creates lightly-doped N-channel source/drain regions 62. The low-dosage arsenic implant and the boron halo implant can be reversed in sequence with an equivalent result.

Figure 7A:
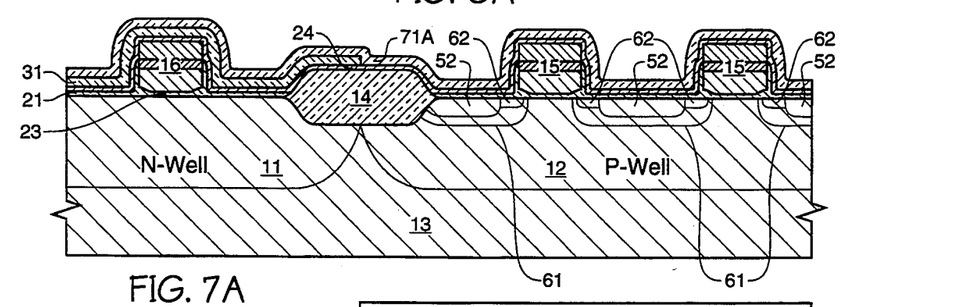
FIG. 7A is a cross-sectional view of the portion of the in-process CMOS circuitry of FIG. 6A following a first photoresist strip step, a thermal drive step, and the deposition of a second ozone TEOS oxide layer.

Referring now to FIG. 7A, the in-process circuitry of FIG. 6A has been subjected to a first photoresist strip step in order to remove first photoresist mask 41A, a thermal drive step, and a second chemical vapor deposition step, which forms a second ozone TEOS oxide layer 71A that blankets the circuitry. The thermal drive step facilitates the incorporation of the implanted high-dosage arsenic impurity into the crystal lattice of the substrate 13, heals damage in the crystal lattice occasioned by the implant step, and drives the implanted arsenic deeper into the substrate. It will be noted that the second ozone TEOS oxide layer 71A covers the unetched first ozone TEOS oxide layer 31 that covers the N-well region 11.

Figure 8A:
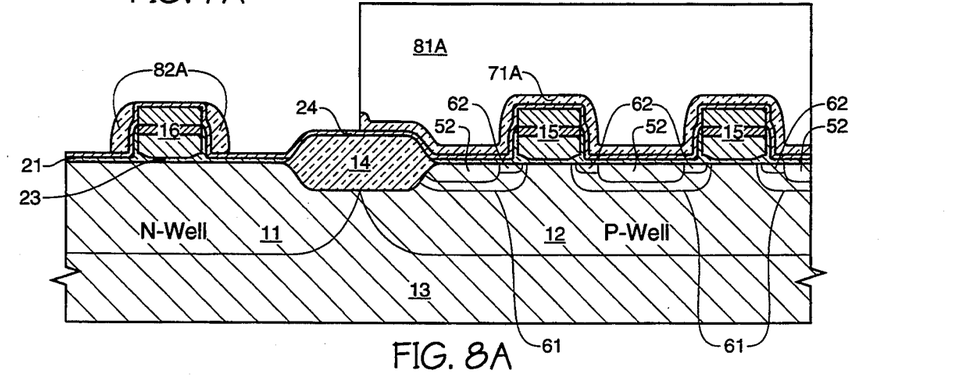
FIG. 8A is a cross-sectional view of the portion of the in-process CMOS circuitry of FIG. 7A following a second photoresist masking step and a subsequent second anisotropic spacer etch.

Referring now to FIG. 8A, the in-process circuitry of FIG. 7A has been masked with a second photoresist mask 81A which masks the P-well region 12, and then subjected to a second anisotropic spacer etch, which forms a second set of spacers 82A on sidewalls of the P-channel transistor gate structures 16. It will be noted that the second set of spacers 82A is formed from both the first ozone TEOS oxide layer 31 and the second ozone TEOS oxide layer 71A. The second set of spacers 82A is sufficiently wide to position the heavy-dosage P⁺ implant which will be subsequently performed so as to optimize the performance of the P-channel devices.

Figure 9A:
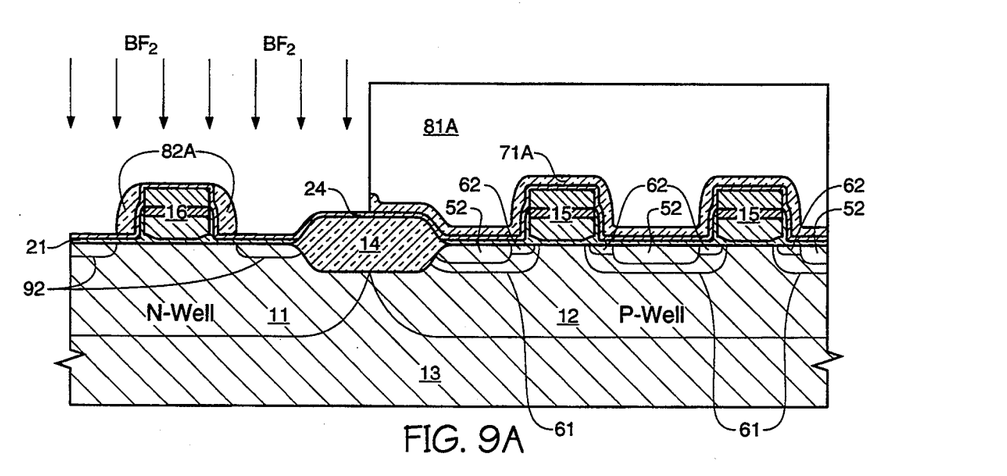
FIG. 9A is a cross-sectional view of the portion of the in-process CMOS circuitry of FIG. 8A following a P+ boron-difluoride source/drain implant step.

Referring now to FIG. 9A, the in-process circuitry of FIG. 8A has been subjected to a P⁺ boron difluoride source/drain implant step, which creates heavily-doped P-channel source/drain regions 92.

Figure 10A:
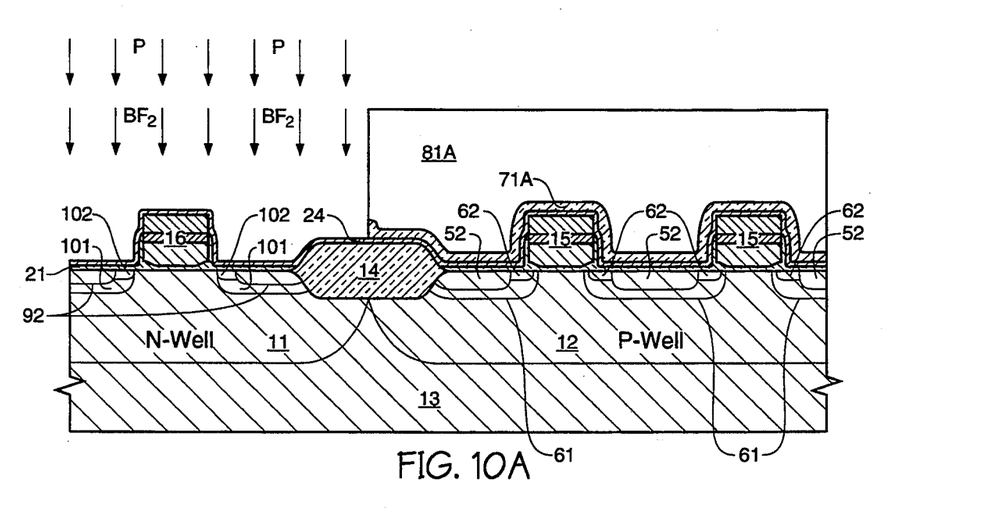
FIG. 10A is a cross-sectional view of the portion of the in-process CMOS circuitry of FIG. 9A after a second wet etch step which removes the disposable spacers on P-channel devices, followed by a phosphorus P-channel anti-punchthrough step, and an optional P−source/drain implant step.

Referring now to FIG. 10A, the in-process circuitry of FIG. 9A has been subjected to a second wet etch step which removes the second set of disposable spacers 82A from the sidewalls of the P-channel transistor gate structures 16. The second wet etch step is followed by a phosphorus halo implant step which creates P-channel anti-punchthrough regions 101, and an optional low-dosage P⁻boron difluoride source/drain implant step which forms lightly-doped P-channel source/drain regions 102. The low-dosage P⁻implant step and the phosphorus halo implant step may be reversed in sequence with an equivalent result.

Figure 11:
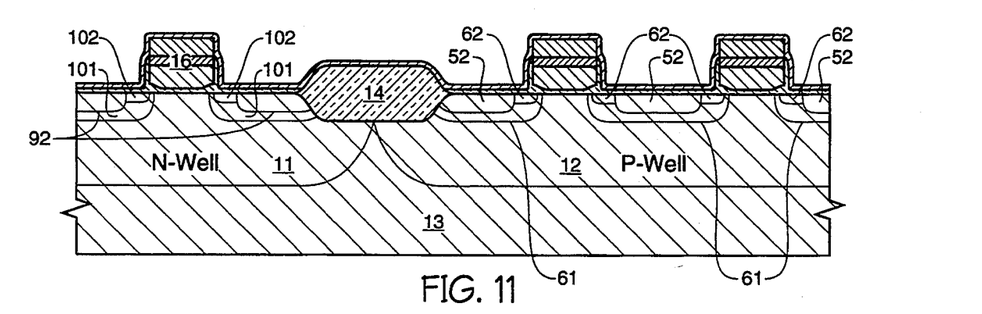
FIG. 11 is a cross-sectional view of the portion of the in-process CMOS circuitry of either FIG. 10 or FIG. 10A following a second photoresist strip step and removal of remaining TEOS oxide.

Referring now to FIG. 11, the in-process circuitry of either FIG. 10 or FIG. 10A has been subjected to a second photoresist strip step which has removed second photoresist mask 91 (in the case of FIG. 10) or second photoresist mask 81A (in the case of FIG. 10A). The second photoresist strip step is followed by the optional removal of remaining TEOS oxide, preferably with a wet etch step.

Although only several embodiments of the invention are disclosed herein, it will be obvious to those having ordinary skill in the art of integrated circuit manufacture that changes and modifications may be made thereto without departing from the scope and the spirit of the invention as hereinafter claimed. For example, although the several embodiments of the process disclosed herein are deemed to be the preferred embodiments, the material of the etch stop layer 24 may be varied, as may be the material of the dielectric layer 19 on top of the gate structure sandwiches 15 and 16. Additionally, the ozone TEOS oxide layers from which the disposable spacers are formed may be replaced with CVD silicon nitride or other suitable types of silicon oxides. In addition, although the process has been described in the context of a "twin-tub" flow characterized by the formation of both N-well regions and P-well regions in a silicon substrate, the process is easily adaptible to a process flow where N-well regions are formed in a P-type substrate or to a process flow where P-well regions are formed in an N-type substrate. Thus, to cover all cases, the claims simply specify N-type regions and P-type regions in an upper stratum of the substrate. In addition, it is well known in the art that the different N-type dopants may be interchanged if provision is made for their different diffusion rates. The same is true for the different P-type dopants.

What is claimed is:

1. A process for fabricating a CMOS integrated circuit on a silicon substrate, said process commencing at a wafer processing stage where N-type and P-type regions have been formed in an upper stratum of the substrate, field isolation regions have been formed on the substrate, and N-channel and P-channel gate structures have been formed, each gate structure having a pair of opposing sidewalls, said process comprising the following steps:

(a) depositing a silicon nitride etch-stop layer which blankets the in-process circuitry;

(b) depositing a first silicon dioxide layer which blankets the in-process circuitry;

(c) performing a first anisotropic spacer etch to form a first set of spacers on the sidewalls of each N-channel gate structure;

(d) masking the N-type regions with photoresist;

(e) performing a high-dosage N-channel source/drain implant;

(f) removing the first set of spacers from the sidewalls of the N-channel gate structures with a wet etch;

(g) performing a low-dosage N-channel source/drain implant;

(h) removing the first photoresist mask;

(i) depositing a second silicon dioxide layer which blankets the in-process circuitry; p1 (j) performing a second anisotropic spacer etch to form a second set of spacers on the sidewalls of each P-channel gate structure;

(k) masking the P-type regions with photoresist;

(l) performing a high-dosage P-channel source/drain implant;

(m) removing the second set of spacers from the sidewalls of the P-channel gate structures;

(n) performing a P-channel anti-punchthrough implant; and (o) removing the second photoresist mask.

2. The process of claim 1, wherein step (c) and step (d) are reversed.

3. The process of claim 1, wherein step (j) and step (k) are reversed.

4. The process of claim 1, wherein all remnants of said first and second silicon dioxide layers are removed following step (o).

5. The process of claim 1, wherein a source/drain reoxidation step is performed prior to step (a).

6. The process of claim 1, wherein said first and second silicon dioxide layers are ozone TEOS oxide.

7. The process of claim 1, wherein a thermal drive step is performed between step (h) and step (i).

8. The process of claim 1, wherein an N-channel anti-punchthrough implant is performed between step (f) and step (h).

9. The process of claim 8, wherein boron is employed for the N-channel anti-punchthrough implant.

10. The process of claim 1, wherein boron difluoride is used for the high-dosage P-channel source/drain implants.

11. The process of claim 1, wherein arsenic is used for both the high-dosage and the low-dosage N-channel source/drain implants.

12. The process of claim 1, wherein a low-dosage P-channel source/drain implant step is performed between step (m) and step (o).

13. The process of claim 1, wherein phosphorus is employed as the P-channel anti-punchthrough implant.

14. The process of claim 1, wherein arsenic is employed as the P-channel anti-punchthrough implant.

15. A process for fabricating a CMOS integrated circuit on a silicon substrate, said process comprising the following steps:

(a) forming N-type regions and P-type regions in an upper stratum of the substrate;

(b) forming field isolation regions on the substrate;

(c) forming N-channel and P-channel gate structures from at least one conductive layer, each gate structure having vertical sidewalls;

(d) forming a first set of spacers on the sidewalls of each N-channel gate structure;

(e) performing a high-dosage N-channel source/drain implant;

(f) removing the first set of spacers from the sidewalls of each N-channel gate structures with a wet etch;

(g) performing a low-dosage N-channel source/drain implant;

(h) forming a second set of spacers on the sidewalls of each P-channel gate structure;

(i) performing a high-dosage P-channel source/drain implant;

(j) removing the second set of spacers from the sidewalls of the P-channel gate structures; and (k) performing a P-channel anti-punchthrough implant.

16. The process of claim 15, wherein the N-type regions are masked with a first photoresist mask between step (c) and step (e).

17. The process of claim 15, wherein the P-type regions are masked with a second photoresist mask between step (g) and step (i).

18. The process of claim 15, wherein a source/drain reoxidation step is performed between step (c) and step (d).

19. The process of claim 15, wherein said first and second spacer sets are formed from ozone TEOS oxide.

20. The process of claim 15, wherein a thermal drive step is performed between step (g) and step (h).

21. The process of claim 15, wherein an N-channel anti-punchthrough implant is performed between step (f) and step (h).

22. The process of claim 21, wherein a boron-containing compound is employed for the N-channel anti-punchthrough implant.

23. The process of claim 15, wherein a low-dosage P-type source/drain implant is performed subsequent to step (j).

24. The process of claim 23, wherein a boron-containing compound is used for both the high-dosage and low-dosage P-channel source/drain implants.

25. The process of claim 15, wherein arsenic is used for both the high-dosage and the low-dosage N-channel source/drain implants.

26. The process of claim 15, wherein phosphorus is employed as the P-channel anti-punchthrough implant.

27. The process of claim 15, wherein arsenic is employed as the P-channel anti-punchthrough implant.

* * * * *